(12) United States Patent
Patel et al.

(10) Patent No.: US 6,476,659 B1
(45) Date of Patent: Nov. 5, 2002

(54) VOLTAGE LEVEL SHIFTER AND PHASE SPLITTER

(75) Inventors: Vimal Ramannhai Patel; Curtis Walter Preuss; Daniel Guy Young, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 09/990,467

(22) Filed: Nov. 21, 2001

(51) Int. Cl.[7] .......................................... H03K 19/0185
(52) U.S. Cl. ......................................... 327/333; 326/81
(58) Field of Search ......................... 327/333, 256–259, 327/239; 326/80, 81

(56) References Cited

U.S. PATENT DOCUMENTS

| | | | | |
|---|---|---|---|---|
| 5,453,707 A | * | 9/1995 | Hiratsuka et al. | 327/259 |
| 5,559,464 A | * | 9/1996 | Orii et al. | 327/333 |
| 6,002,290 A | * | 12/1999 | Avery et al. | 327/333 |
| 6,020,779 A | * | 2/2000 | Udo | 327/333 |
| 6,046,621 A | * | 4/2000 | Crowley | 327/333 |
| 6,323,711 B2 | * | 11/2001 | Truong et al. | 327/239 |

* cited by examiner

Primary Examiner—Toan Tran
(74) Attorney, Agent, or Firm—Joan Pennington

(57) ABSTRACT

A high speed voltage level shifter and phase splitter circuit is provided. The voltage level shifter and phase splitter circuit includes an input signal and a first input inverter stage that receives the input signal and provides an inverted delayed out of phase signal to the input signal. A buffer stage receives the input signal and provides a buffered delayed in phase signal to the input signal. A first constant current source is coupled between the first input inverter stage and the buffer stage. A first output inverter stage is coupled to the first constant current source and provides a voltage level shifted and out of phase signal to the input signal. A second constant current source is coupled between the first input inverter stage and the buffer stage having an opposite polarity as the first constant current source. A second output inverter stage is coupled to the second constant current source and providing a voltage level shifted and in phase signal to the input signal.

13 Claims, 8 Drawing Sheets

VOLTAGE LEVEL SHIFTER AND PHASE SPLITTER

FIELD OF THE INVENTION

The present invention relates generally to a high speed voltage shifter and phase splitter circuit.

DESCRIPTION OF THE RELATED ART

FIGS. 1 and 2 together illustrate a prior art voltage level shifter for providing first and second phase outputs. In FIG. 1, an input voltage A1IN is applied to the voltage level shifter to produce a first phase output D. In FIG. 2, an input voltage A2IN is applied to the voltage level shifter to produce a second phase output D2. The input voltage A1IN and the input voltage A2IN are out of phase with each other.

Referring to both FIGS. 1 and 2, the respective input voltages A1IN and A2IN are applied to input inverter stages coupled to a first voltage supply VDD. Node B2 is inverter delayed by a single inverter stage formed of P-channel field effect transistor (PFET) P1 and an N-channel field effect transistor (NFET) N1 and out of phase to A1IN in FIG. 1 or A2IN in FIG. 2. Node BBB2 is buffer delayed by a pair of parallel inverters formed by P2, N2 and P3, N3 and is in phase with A1IN in FIG. 1 or A2IN in FIG. 2. The input inverters NFETs N1 and N3 are connected to a common node labeled NET3 and to a respective pair of NFETs N5, N6 and N7, N8. Node NET 3 is coupled to a second voltage supply VDDQ via a pair of NFETs N9, N10. Output inverter stages formed of P11, N11, and P12, N12 coupled between a second voltage supply VDDQ via a pair of PFETs P13, P14 and ground via a pair of NFETs N13, N14. PFET P13 is always turned on by a low enable input ENBAR applied to the gate input. NFET N14 is always turned on by a high enable input ENN applied to the gate input. NFETs N6 and N8 are turned on by a high enable input ENN applied to the gate input, which together with NFETs N5 and N7 help to pull node NET3 low. Output inverter stages formed of P11, N11, and P12, N12 respectively receive a gate input of BBB2 and B2.

FIGS. 4, 5, and 6 illustrate voltage waveforms of the prior art voltage level shifter of FIGS. 1 and 2 with voltage shown relative the vertical axis and time shown relative to the horizontal axis. In FIG. 4, voltage waveforms A1IN, B2, BBB2, and NET3 are illustrated. FIG. 5 provides an expanded view of the voltage waveforms A1IN, B2, BBB2, and NET3 of FIG. 4. FIG. 6 illustrates the input voltage waveform A1IN together with outputs D and D2 of FIGS. 1 and 2. The prior art level shifter has an operational time delay that is much greater than can be used effectively for high speed applications. Another problem with the prior art level shifter is that balanced output is not provided. As illustrated in FIG. 6, with VDDQ of 1.5 Volts, the cross point of outputs D and D2 is at about 1.07 Volts, rather than VDDQ/2 or 0.75 Volts.

A need exists for an improved high speed voltage shifter and phase splitter circuit. It is desirable to provide such a voltage shifter and phase splitter circuit that achieves balanced outputs as well as a small delay. It is also desirable to provide such a voltage shifter and phase splitter circuit that minimizes the number of devices required to produce two phases so that less physical area is required.

SUMMARY OF THE INVENTION

A principal object of the present invention is to provide an improved high speed voltage shifter and phase splitter circuit. Other important objects of the present invention are to provide such voltage shifter and phase splitter circuit substantially without negative effect and that overcomes many of the disadvantages of prior art arrangements.

In brief, a high speed voltage level shifter and phase splitter circuit is provided. The voltage level shifter and phase splitter circuit includes an input signal. A first input inverter stage receives the input signal and provides an inverted delayed out of phase signal to the input signal. A buffer stage receives the input signal and provides a buffered delayed in phase signal to the input signal. A first constant current source is coupled between the first input inverter stage and the buffer stage. A first output inverter stage is coupled to the first constant current source and provides a voltage level shifted and out of phase signal to the input signal. A second constant current source is coupled between the first input inverter stage and the buffer stage having an opposite polarity as the first constant current source. A second output inverter stage is coupled to the second constant current source and providing a voltage level shifted and in phase signal to the input signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENT

Figure 3:
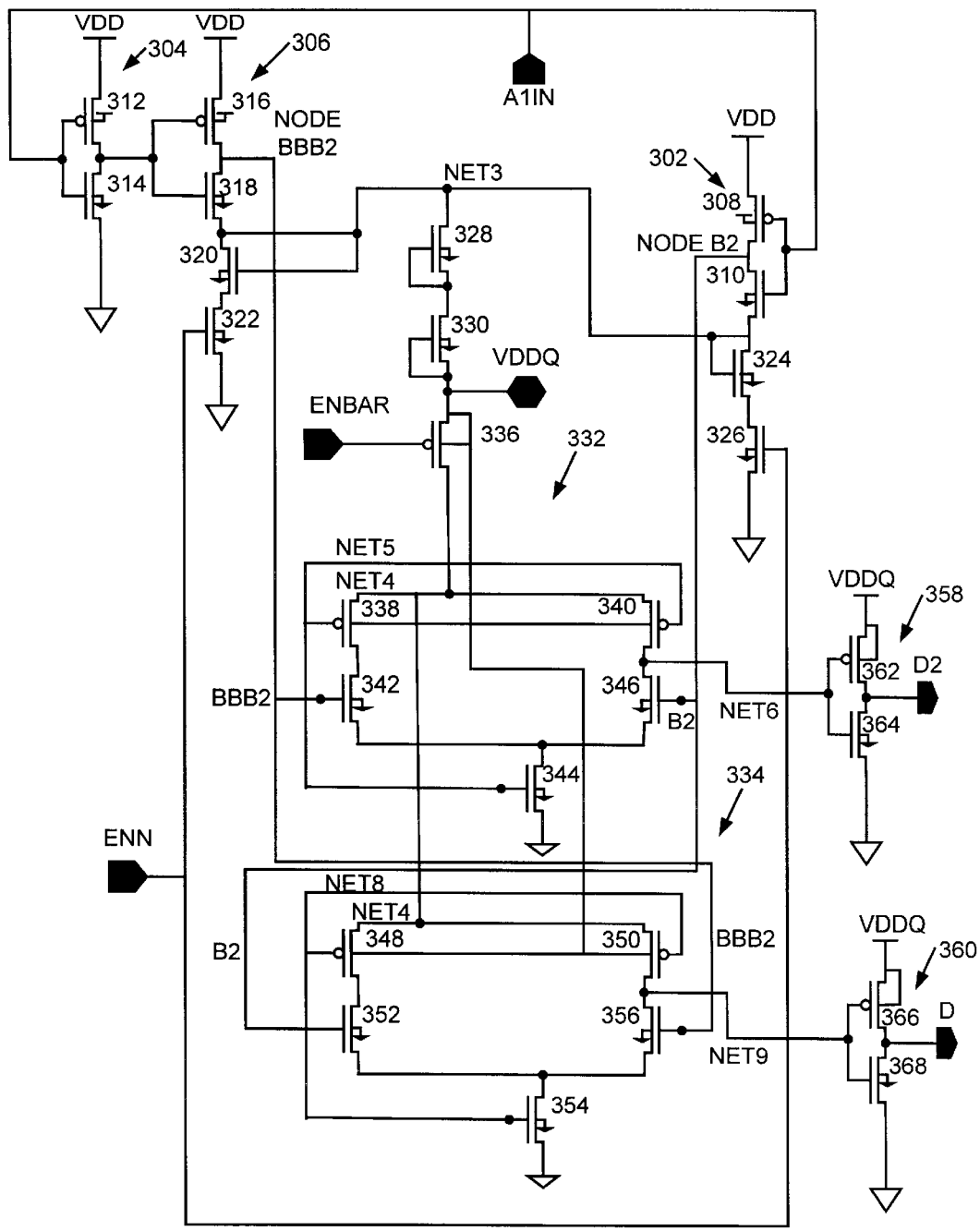
FIG. 3 is a schematic diagram of a combined voltage level shifter and phase splitter circuit in accordance with the preferred embodiment.
Figure 4:
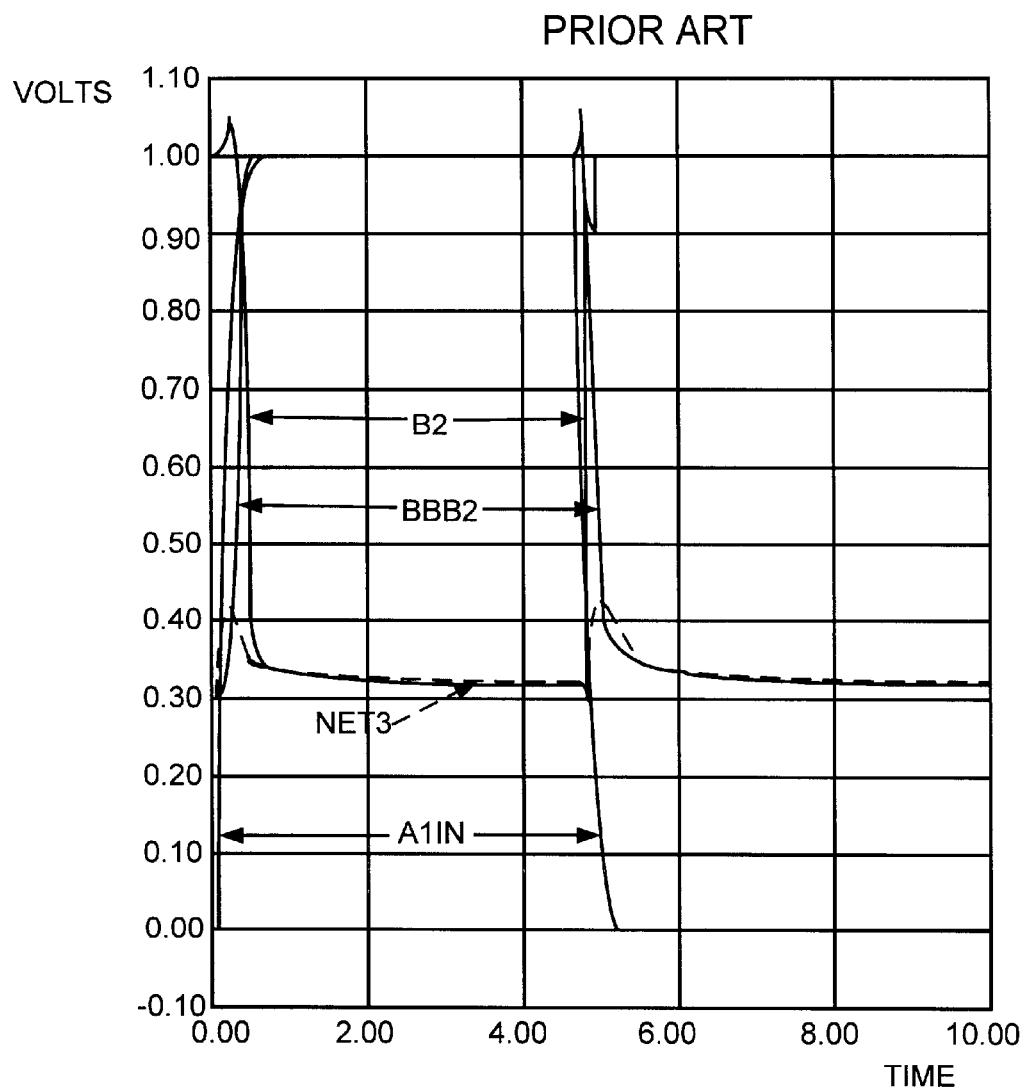
FIGS. 4, 5, and 6 illustrate voltage waveforms of the prior art voltage level shifter of FIGS. 1 and 2 with voltage shown relative the vertical axis and time shown relative to the horizontal axis.
Figure 5:
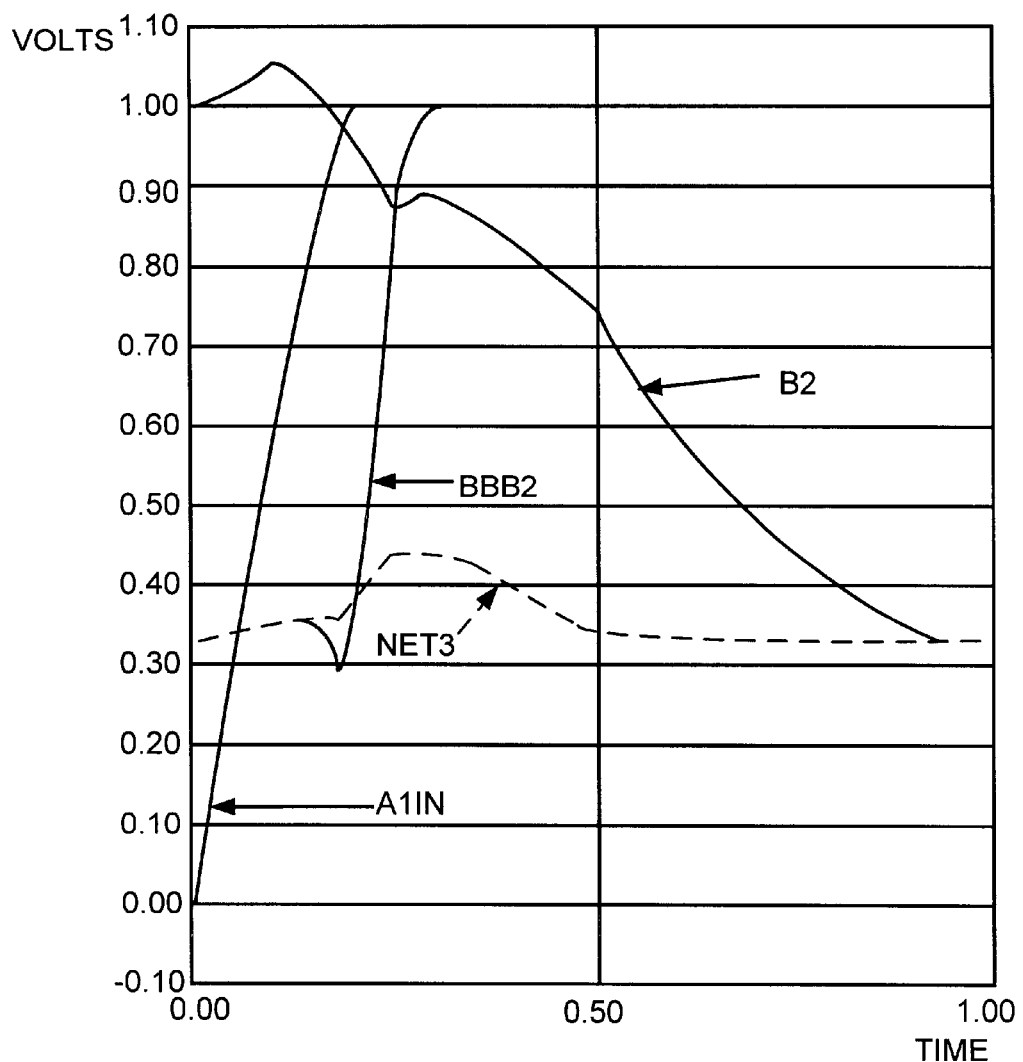
Figure 6:
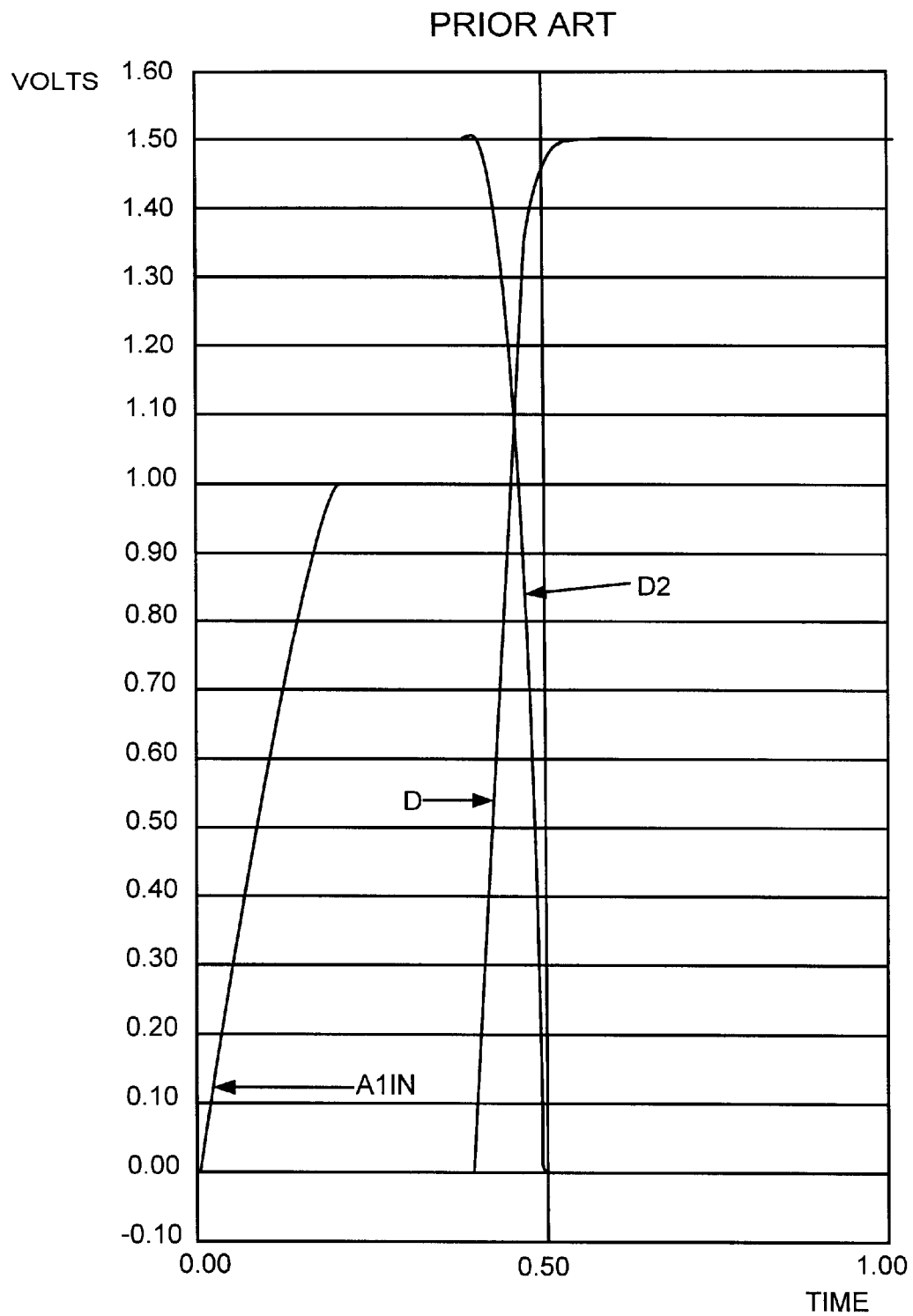

Having reference now to the drawings, in FIG. 3 there is shown a combined voltage level shifter and phase splitter circuit generally designated by the reference character 300 in accordance with the preferred embodiment.

Figure 1:
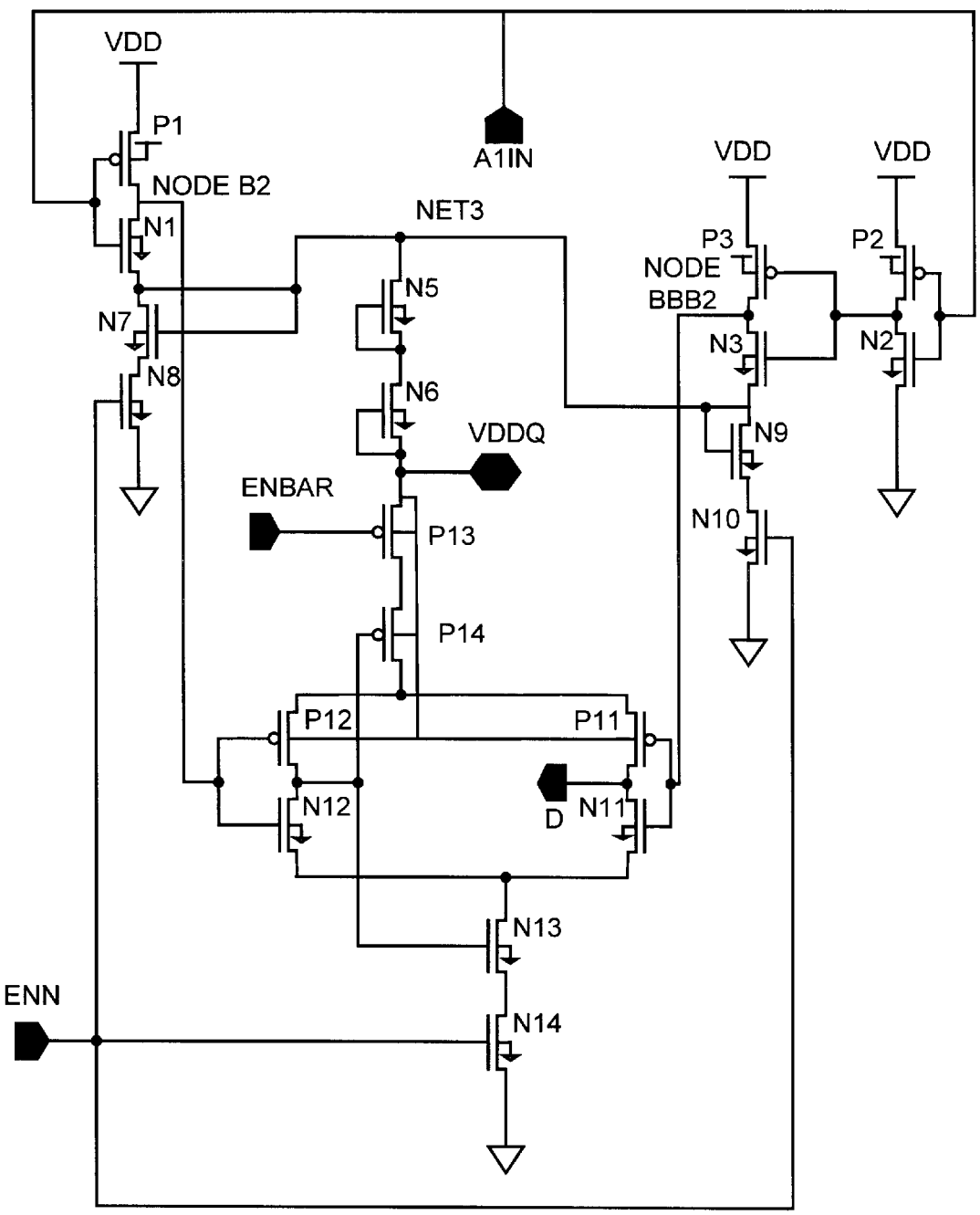
FIGS. 1 and 2 are schematic diagrams of a prior art voltage level shifter.
Figure 2:
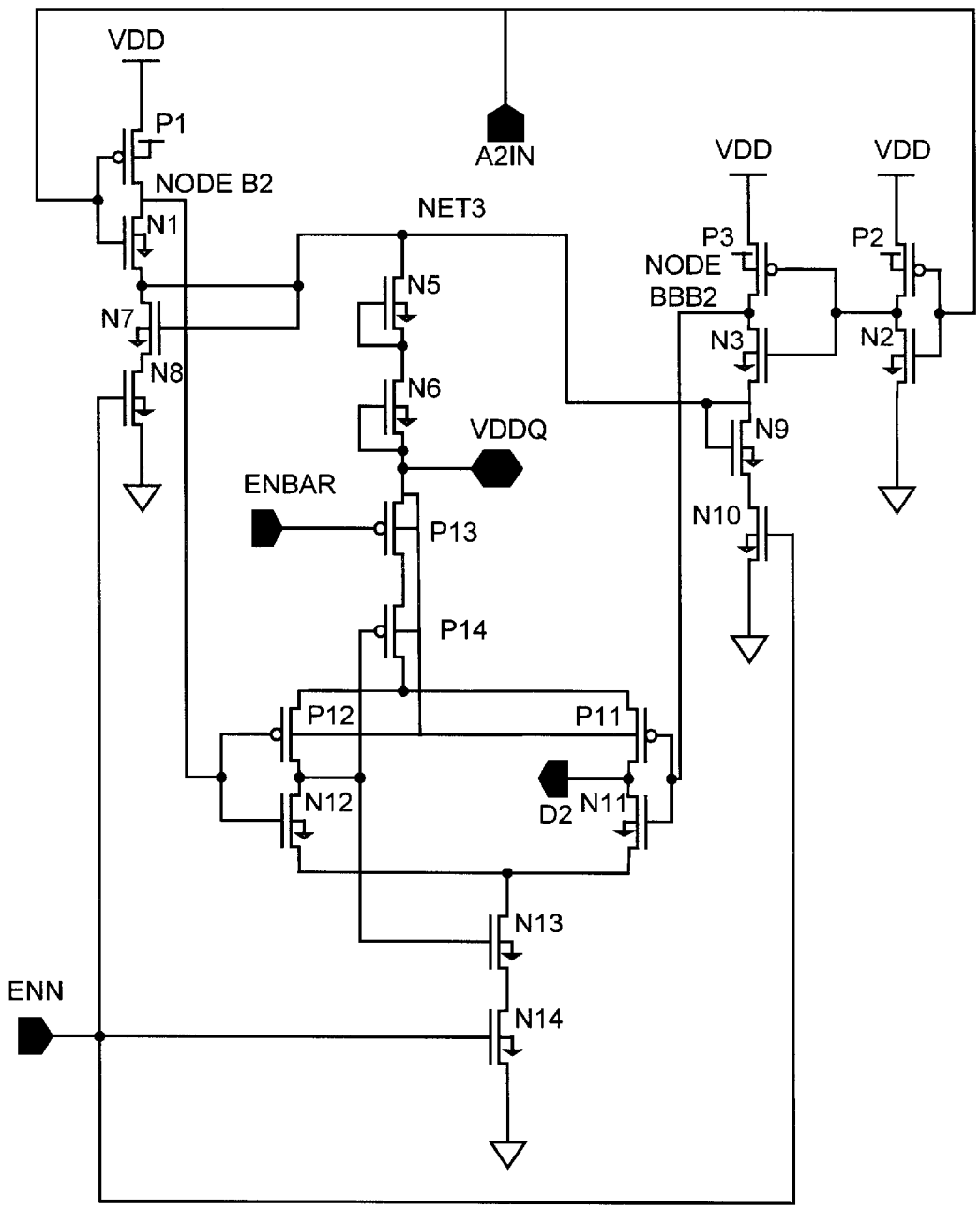

In accordance with features of the preferred embodiment, combined voltage level shifter and phase splitter circuit 300 achieves better performance, balanced output, less FETs are used and less physical area is used, as compared to the prior art voltage level shifter of FIGS. 1 and 2. The voltage level shifter and phase splitter circuit 300 is much faster and can run, for example, at a speed of 1 GHz. Voltage level shifter and phase splitter circuit 300 includes constant current sources and produces substantially balanced outputs of first and second phase outputs D and D2.

Voltage level shifter and phase splitter circuit 300 includes a plurality of input inverter stages 302, 304, and 306 coupled to a first voltage supply VDD. An input signal A1IN, for example, of 0.9V–1.5V is applied to the input inverter stages 302 and 304. Node B2 is inverter delayed by the single inverter stage 302 formed of P-channel field effect transistor (PFET) 308 and an N-channel field effect transistor (NFET) 310 and is out of phase to the input signal A1IN. Node BBB2 is buffer delayed by the pair of parallel inverters 304 and 306 formed by 312, 314 and 316, 318 and is in phase with the input signal A1IN. The input inverter NFETs 310 and 318 are connected to a common node labeled NET3 and to a respective pair of NFETs 320, 322 and 324 and 326. Node NET3 is coupled to a second voltage supply VDDQ via a pair of NFETs 328, 330. An enable input ENN is applied to the gate input of NFETs 322 and 326 and is normally high, which helps NET3 pull down via NFETs 320, 322 and 324 and 326. The input inverter stages 302, 304, and 306 and node NET 3 generally correspond to the prior art voltage level shifter of FIG. 1.

The inverter 302 and buffer stage formed by inverters 304 and 306 are tuned such that delay at node BBB2 and B2 is about the same. Voltage for example, of 1.4V–1.6V to be shifted is applied at input VDDQ.

Voltage level shifter and phase splitter circuit 300 includes a pair of constant current sources generally designated by the reference characters 332 and 334 in accordance with the preferred embodiment. A first PFET 336 is coupled between input VDDQ and a node NET4. NET4 is a source connection of a pair of PFETs 338 and 340 of the constant current source 332. PFET 338 is connected in series with NFETs 342 and 344. PFET 340 is connected in series with NFETs 346 and 344. The gates of PFETs 338 and 340 are connected together and connected to the gate of NFET 344 at a node NET5. The gate of NFET 342 is connected to node BBB2. The gate of NFET 346 is connected to node B2. The drain connection of PFET 340 and NFET 346 define an output node NET6.

Constant current source 334 is similarly arranged with an opposite polarity connection to nodes B2 and BBB2 as the first constant current source 332. Constant current source 334 includes a source connection of a pair of PFETs 348 and 350 connected to node NET4. PFET 348 is connected in series with NFETs 352 and 354. PFET 350 is connected in series with NFETs 356 and 354. The gates of PFETs 348 and 350 are connected together and connected to the gate of NFET 354 at a node NET8. The gate of NFET 352 is connected to node B2. The gate of NFET 356 is connected to node BBB2. The drain connection of PFET 350 and NFET 356 define an output node NET9.

When ENBAR is low PFET 336 turns on and NET4 is approximately at VDDQ. PFETs 338 and 340 and PFETs 348 and 350 are self-biased and function as a resistor. In operation, an input signal A1IN is applied, node BBB2 rises following input signal A1IN and node B2 falls. When node BBB2 rises up to VDD/2 and node B2 falls down to VDD/2, at that time equal amount of current is flowing through NFET 342 and NFET 346 and through NFET 352 and 356. Such arrangement gives equal amount of current through each leg, producing balanced outputs D and D2. In one cycle, node B2 is low, NFET 346 of current source 332 and NFET 352 of current source 334 turn off. At that time, node BBB2 is high, NFET 342 of current source 332 and NFET 356 of current source 334 are on. In a next cycle, node B2 is high, NFET 346 of current source 332 and NFET 352 of current source 334 are on. At that time, node BBB2 is low, NFET 342 of current source 332 and NFET 356 of current source 334 turn off. NFETs 344 and 354 receiving constant current are constantly on.

A pair of output inverter 358 and 360 is coupled to the nodes NET6 and NET9 of the first and second constant current sources 332 and 334. A PFET 362 and an NFET 364 connected in series between VDDQ and ground forms the output inverter 358 with a gate input connected to NET6. The drain connection of PFET 362 and NFET 364 define an output node D2. Similarly, a PFET 366 and an NFET 368 forms the output inverter 360 with a gate input connected to NET9. The drain connection of PFET 366 and NFET 368 define an output node D.

When A1IN goes high, BBB2 will go high and NFET 356 will turn on and the output D of output inverter 360 is in phase with A1IN and voltage level is shifted at VDDQ (1.4V–1.6V). When A1IN goes high, B2 will go low and NFET 346 will turn off and the output D2 of output inverter 358 is out of phase to A1IN and voltage level is shifted at VDDQ.

Figure 7:
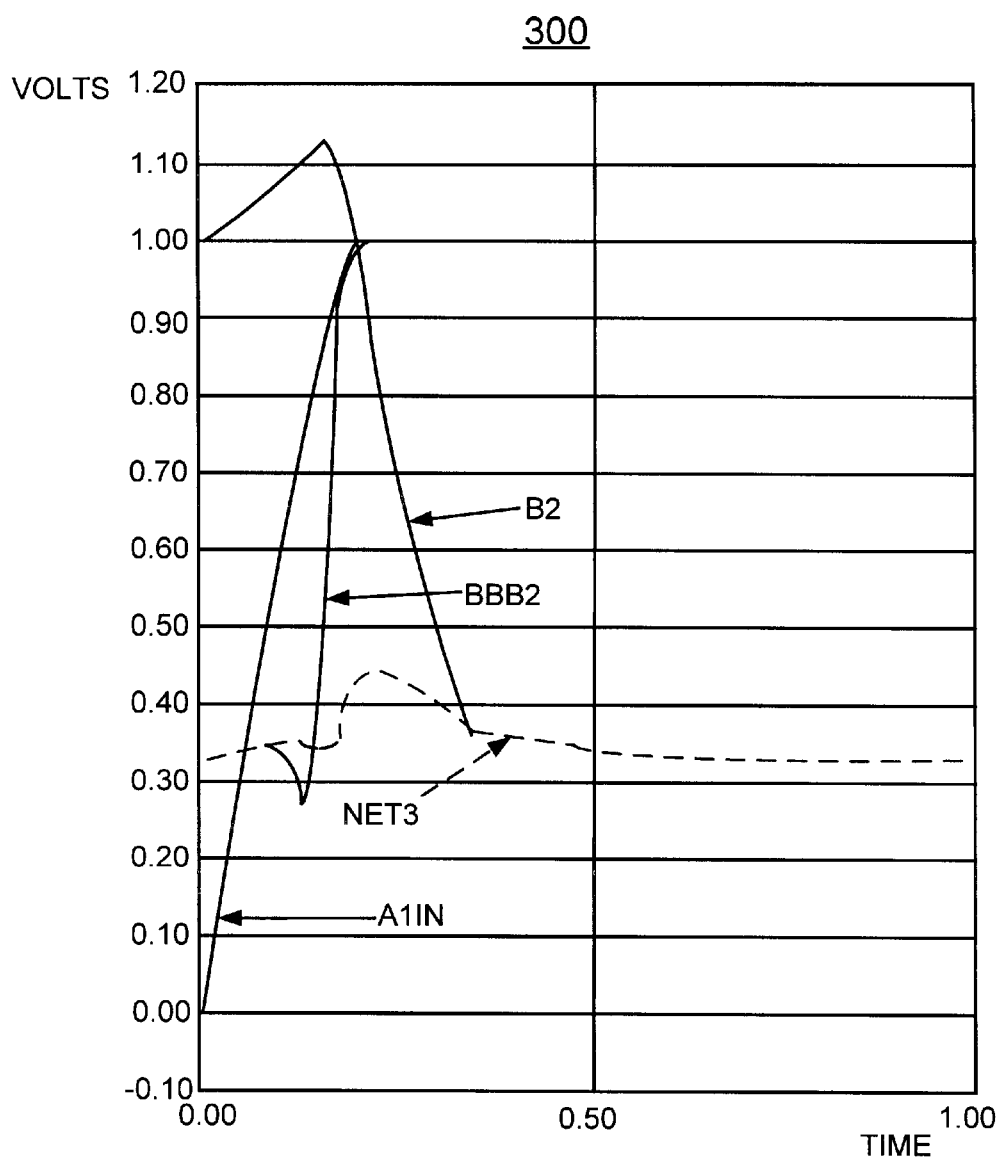
FIGS. 7 and 8 illustrate voltage waveforms of the combined voltage level shifter and phase splitter of FIG. 3 in accordance with the preferred embodiment with voltage shown relative the vertical axis and time shown relative to the horizontal axis.
Figure 8:
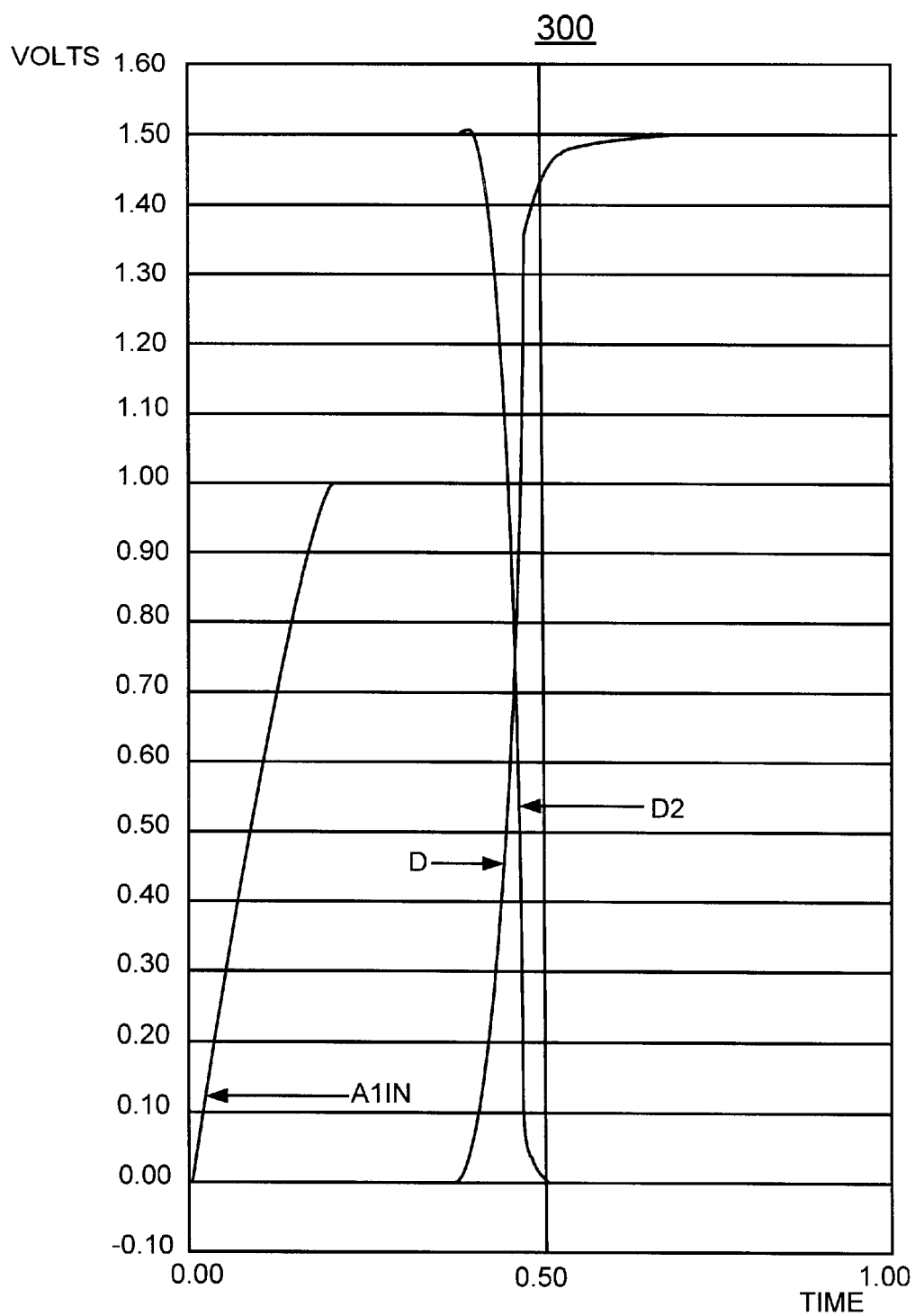

FIGS. 7 and 8 illustrate voltage waveforms of the combined voltage level shifter and phase splitter 300 in accordance with the preferred embodiment with voltage shown relative the vertical axis and time shown relative to the horizontal axis. FIG. 7 provides an expanded view of the voltage waveforms A1IN, B2, BBB2, and NET3. FIG. 8 illustrates the input voltage waveform A1IN together with outputs D and D2 of the combined voltage level shifter and phase splitter 300 of FIG. 3. Note that the cross point of outputs D and D2 is at about 0.75 Volts or VDDQ/2, resulting from the constant current sources 332 and 334 in the voltage level shifter and phase splitter 300. Balanced outputs D and D2 of the combined voltage level shifter and phase splitter 300 of FIG. 3 are provided with an improvement of 98 pico-seconds in operational time delay as compared to the prior art voltage level shifter of FIGS. 1 and 2.

While the present invention has been described with reference to the details of the embodiments of the invention shown in the drawing, these details are not intended to limit the scope of the invention as claimed in the appended claims.

What is claimed is:

1. A voltage level shifter and phase splitter circuit comprising:

an input signal;

a first input inverter stage receiving said input signal and providing an inverted delayed out of phase signal to said input signal;

a buffer stage receiving said input signal and providing a buffered delayed in phase signal to said input signal;

a first constant current source coupled between said first input inverter stage and said buffer stage;

a first output inverter stage coupled to said first constant current source and providing a voltage level shifted and out of phase signal to said input signal;

a second constant current source coupled between said first input inverter stage and said buffer stage with an opposite polarity as said first constant current source; and a second output inverter stage coupled to said second constant current source and providing a voltage level shifted and in phase signal to said input signal.

2. A voltage level shifter and phase splitter circuit as recited in claim 1 wherein said buffer stage receiving said input signal and providing said buffered delayed in phase signal to said input signal includes a pair of inverter stages.

3. A voltage level shifter and phase splitter circuit as recited in claim 1 wherein each of said first constant current source and said second constant current source includes a pair of P-channel field effect transistors (PFETs) having a source coupled to a voltage supply VDDQ and each of said pair of PFETs being self-biased to function as a resistor.

4. A voltage level shifter and phase splitter circuit as recited in claim 3 wherein each of said first constant current source and said second constant current source includes a pair of N-channel field effect transistors (NFETs) connected in series with said pair of PFETs and said pair of NFETs having a source connection to a drain of a third N-channel field effect transistor (NFET) and having a respective gate connection to a respective output of said first input inverter stage and said buffer stage; said third NFET having a source connected to ground and being constantly on.

5. A voltage level shifter and phase splitter circuit as recited in claim 4 wherein each of said first constant current source and said second constant current source includes a respective drain connection of a respective one of said pair of series connected PFETs and NFETs respectively connected to said first output inverter stage and said second output inverter stage.

6. A voltage level shifter and phase splitter circuit as recited in claim 5 wherein each of said first output inverter stage and said second output inverter stage include a series connected P-channel field effect transistor and N-channel field effect transistor connected between said voltage supply VDDQ and ground and having a gate connection to said respective drain connection of one of said first constant current source and said second constant current source.

7. A voltage level shifter and phase splitter circuit as recited in claim 1 wherein said first input inverter stage receiving said input signal and providing said inverted delayed out of phase signal to said input signal and said buffer stage receiving said input signal and providing a buffered delayed in phase signal to said input signal are arranged to provide approximately equal delay.

8. A voltage level shifter and phase splitter circuit as recited in claim 1 wherein said voltage level shifted and out of phase signal to said input signal provided by said first output inverter stage and said voltage level shifted and in phase signal to said input signal provided said second output inverter stage are substantially balanced outputs.

9. A voltage level shifter and phase splitter circuit comprising:

an input signal;

a first input inverter stage receiving said input signal and providing an inverted delayed out of phase signal to said input signal;

a buffer stage receiving said input signal and providing a buffered delayed in phase signal to said input signal; said inverted delayed out of phase signal to said input signal and said buffered delayed in phase signal. to said input signal having approximately equal delay;

a first constant current source coupled between said first input inverter stage and said buffer stage;

a first output inverter stage coupled to said first constant current source and providing a voltage level shifted and out of phase signal to said input signal;

a second constant current source coupled between said first input inverter stage and said buffer stage with an opposite polarity as said first constant current source; and a second output inverter stage coupled to said second constant current source and providing a voltage level shifted and in phase signal to said input signal; said voltage level shifted and out of phase signal to said input signal provided by said first output inverter stage and said voltage level shifted and in phase signal to said input signal provided said second output inverter stage being substantially balanced outputs.

10. A voltage level shifter and phase splitter circuit as recited in claim 9 wherein each of said first constant current source and said second constant current source includes a pair of P-channel field effect transistors (PFETs) having a source coupled to a voltage supply VDDQ and each of said pair of PFETs being self-biased to function as a resistor.

11. A voltage level shifter and phase splitter circuit as recited in claim 10 wherein each of said first constant current source and said second constant current source includes a pair of N-channel field effect transistors (NFETs) connected in series with said pair of PFETs and said pair of NFETs having a source connection to a drain of a third N-channel field effect transistor (NFET) and having a respective gate connection to a respective output of said first input inverter stage and said buffer stage; said third NFET having a source connected to ground and being constantly on.

12. A voltage level shifter and phase splitter circuit as recited in claim 11 wherein each of said first constant current source and said second constant current source includes a respective drain connection of a respective one of said pair of series connected PFETs and NFETs respectively connected to said first output inverter stage and said second output inverter stage.

13. A voltage level shifter and phase splitter circuit as recited in claim 12 wherein each of said first output inverter stage and said second output inverter stage include a series connected P-channel field effect transistor and N-channel field effect transistor connected between said voltage supply VDDQ and ground and having a gate connection to said respective drain connection of one of said first constant current source and said second constant current source.

* * * * *